United States Patent [19]

Suh et al.

[11] Patent Number: 5,321,653

[45] Date of Patent: Jun. 14, 1994

[54] CIRCUIT FOR GENERATING AN INTERNAL SOURCE VOLTAGE

[75] Inventors: Young-Ho Suh, Suwon; Suk-Bin Kim, Seoul, both of Rep. of Korea

[73] Assignee: Samsung Electronics Co., Ltd., Kyungki, Rep. of Korea

[21] Appl. No.: 35,761

[22] Filed: Mar. 24, 1993

[30] Foreign Application Priority Data

Mar. 31, 1992 [KR] Rep. of Korea ............... 5350/1992

[51] Int. Cl.[5] .................... G11C 5/14; G05F 13/16
[52] U.S. Cl. ..................... 365/189.09; 365/189.07; 365/226; 365/189.11; 307/296.8; 307/264
[58] Field of Search ............ 365/189.09, 189.07, 365/226, 189.06, 189.11; 307/303, 296.6, 296.8, 362, 264

[56] References Cited

U.S. PATENT DOCUMENTS

| | | | |
|---|---|---|---|
| 4,833,341 | 5/1989 | Watanabe et al. | 307/296.1 |
| 5,046,052 | 9/1991 | Miyaji et al. | 365/226 |
| 5,077,518 | 12/1991 | Han | 323/275 |
| 5,103,158 | 4/1992 | Otto et al. | 323/314 |
| 5,132,555 | 7/1992 | Takahashi | 307/296.1 |
| 5,249,155 | 9/1993 | Arimoto et al. | 365/222 |

Primary Examiner—Eugene R. LaRoche
Assistant Examiner—Andrew Q. Tran
Attorney, Agent, or Firm—Robert A. Westerlund; Charles R. Donohoe; Stephen R. Whitt

[57] ABSTRACT

A circuit for generating an internal source voltage which is applied to the memory elements of a semiconductor device. The circuit includes a reference voltage generating circuit for generating a reference voltage, a comparator for comparing the internal source voltage with the reference voltage, a driver for driving an external source voltage into the internal source voltage under the control of the comparator, and a low reference voltage generating circuit for generating a control signal to fully turn on the driver when the voltage level of the external source voltage is lower than the voltage level of the reference voltage generating circuit and which prevents the driver from receiving the output signal of the comparator so as to apply the external source voltage to the memory element of the memory device.

5 Claims, 3 Drawing Sheets

5,321,653

CIRCUIT FOR GENERATING AN INTERNAL SOURCE VOLTAGE

BACKGROUND OF THE INVENTION

The present invention relates to a semiconductor memory device, and more particularly to a circuit for generating an internal source voltage in a semiconductor memory device.

As semiconductor memory devices have become more highly integrated, the memory cells in the memory devices have become increasingly miniaturized. Hence, if an external voltage supplied to the memory device is not properly adjusted, a strong electric field may be formed which will cause a stress to be applied to the memory device, thereby damaging the memory elements. The semiconductor memory devices having 16 Megabits should employ a circuit for generating an internal voltage to drop the level of the external voltage to the level of the operating voltage of the memory device. For example, semiconductor memory devices over 16 Megabits should use an internal voltage of 4V which is usually obtained by dropping the external voltage of 5V.

FIG. 1 shows a conventional circuit for generating an internal source voltage according to prior art. This circuit includes a reference voltage generating circuit 100 for generating a reference voltage Vrefs. Comparator 200 compares the internal source voltage int.Vcc with the reference voltage Vref. A driver 90 couples the external voltage ext.Vcc to the internal source voltage int.Vcc under the control of the comparator 200 and a burn-in reference voltage generating circuit 300. The internal source voltage int.Vcc is applied to the memory elements of the memory device, as well as, to an NMOS transistor N2 of the comparator 200. If the internal source voltage int.Vss drops below the reference voltage Vref, the level of the output signal G1 of the comparator 200 drops so as to fully turn on the driver 90 to compensate for the dropping internal source voltage int.Vcc. Alternatively, if the internal source voltage int.Vcc is increased above the reference voltage Vref, the output signal G1 of the comparator 200 is increased so as to turn off the driver 90 to permit the internal source voltage int.Vcc to drop to the reference voltage Vref.

If the voltage level of the external source voltage ext.Vcc is higher than the voltage level of the burn-in reference voltage, the burn-in reference voltage generating circuit 300 generates an output signal G3 having a logic "high" state so as to turn off transmission gates N4, P3 through inverters I1 and I2 and turn on a pull down transistor N5, so that the external source voltage ext.Vcc is applied to the memory device through the driver 90. In this case, since the transmission gate N4, P3 is turned off, the output signal G1 of the comparator 200 does not affect the signal G2 which is applied to a gate of the driver 90.

In such a conventional circuit for generating the internal source voltage, if the voltage level of the external source voltage ext.Vcc is lower than the voltage level of the reference voltage Vref, the transmission gate N4, P3 is turned on so as to cause the output signal G1 of the comparator to affect the driver 90. Consequently, when the internal source voltage int.Vcc is changed by a peak current generated in the memory drive, the voltage G2 changes so as to instantly drop the internal source voltage int.Vcc below the external source voltage. Thus, the operating speed of the memory elements is slowed down to cause an improper functioning of the memory.

SUMMARY OF THE INVENTION

It is an object of the present invention to provide a circuit for generating an internal source voltage for supplying an external source voltage directly to the memory elements of a semiconductor memory device when the voltage level of the external source voltage is lower than the voltage level of a reference voltage.

It is another object of the present invention to provide a circuit for generating an internal source voltage for preventing the operating speed of the memory elements from being slowed down due to the instant dropping of the internal source voltage.

According to the present invention, a circuit for generating an internal source voltage applied to the memory elements of a semiconductor device includes a reference voltage generating circuit for generating a reference voltage. A comparator compares the internal source voltage with the reference voltage. A driver couples an external source voltage to the internal source voltage under the control of the comparator. A low reference voltage generating circuit generates a control signal to turn on the driver when the voltage level of the external source voltage is lower than the voltage level of the reference voltage. Thus, the control signal from the low reference voltage generating circuit prevents the driver from receiving the output signal of the comparator and thus prevents the external source voltage from being coupled to the memory elements of the memory device.

DETAILED DESCRIPTION OF THE PREFERRED EMBODIMENT

Figure 1:
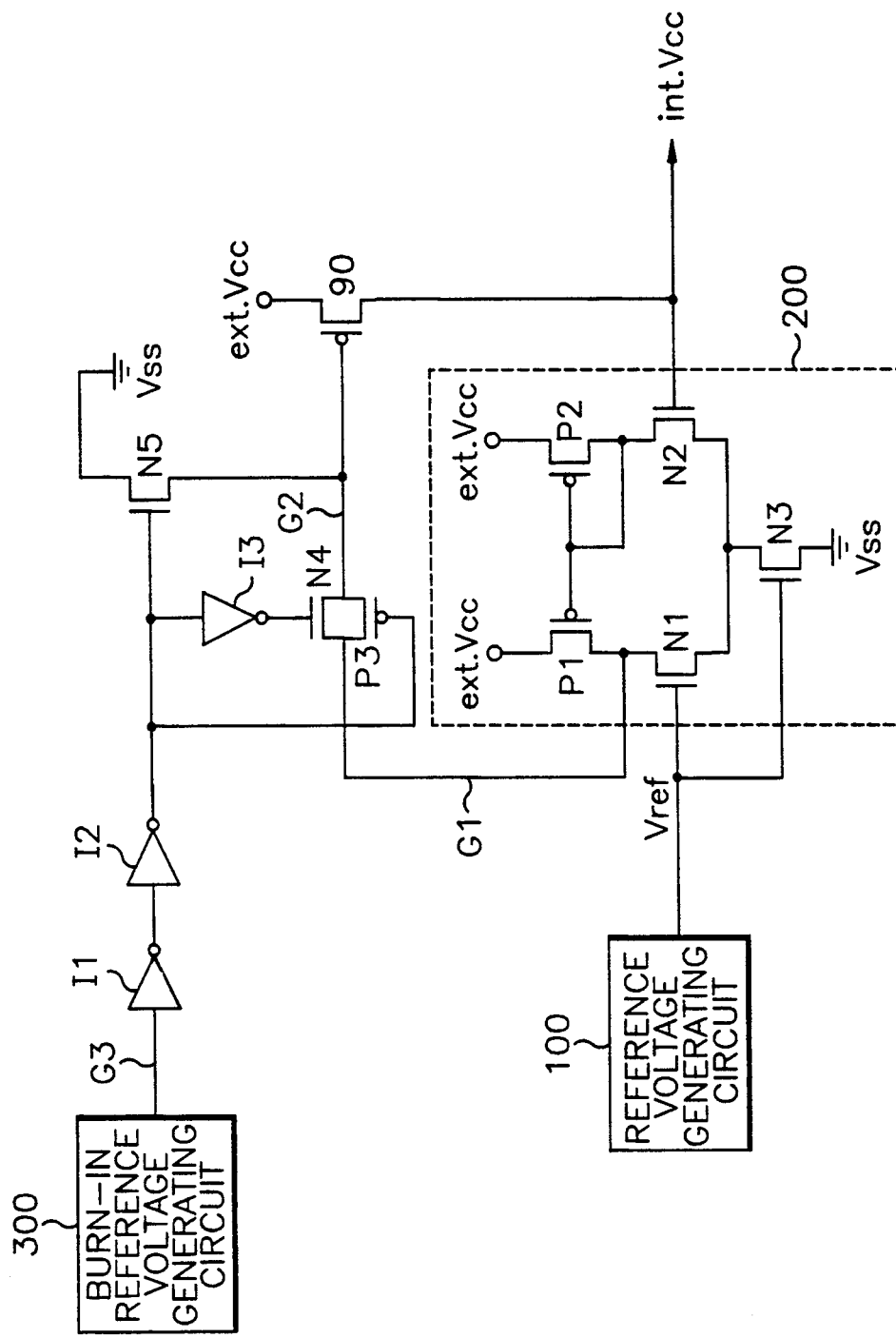
FIG. 1 is a schematic diagram of a conventional circuit for generating an internal source voltage.
Figure 2:
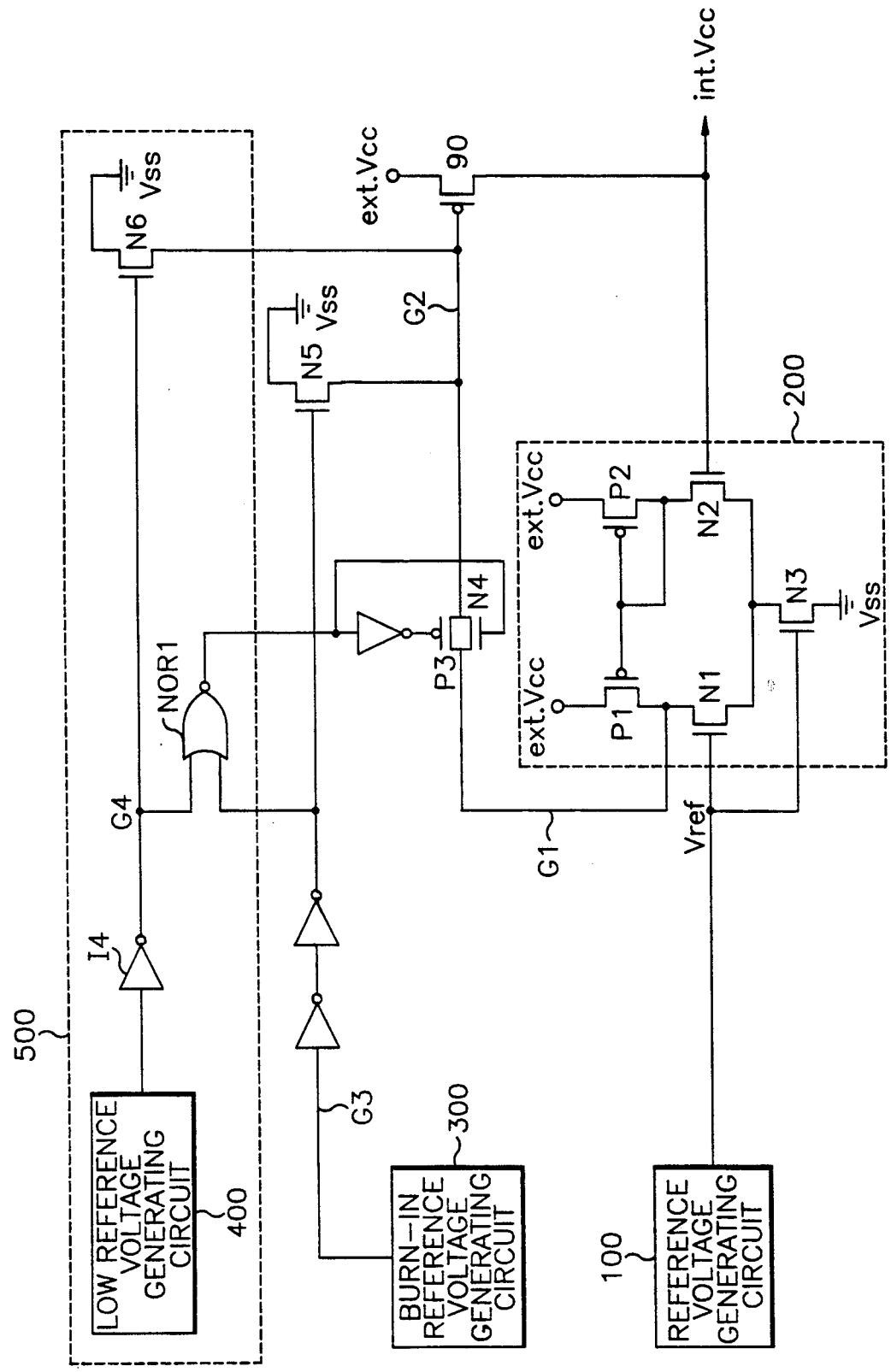
FIG. 2 is a schematic diagram of a circuit for generating an internal source voltage according to preferred embodiments of the present invention.

Referring to FIG. 2, a reference voltage generating circuit 100 generates a reference voltage Vref. A comparator 200 compares an internal source voltage int.Vcc with the reference voltage Vref. A driver 90 couples an external source voltage ext.Vcc into the internal source voltage int.Vcc, i.e., which supplies the memory elements under the control of the comparator 200. A burn-in reference voltage generating circuit 300 generates an output signal G3 which, when high, prevents the driver 90 from receiving the output signal G1 of the comparator and fully turns on the driver 90. A low reference voltage generating circuit 400 generates a control signal to prevent the driver 90 from receiving the output signal G1 from the comparator and fully turns on the driver 90 when the voltage level of the external source voltage, ext.Vcc, is lower than the voltage level of the reference voltage Vref.

The burn-in reference voltage generating circuit 300 generates an output signal G3 having a logic "high" state for turning off transmission gates N4, P3, and so that a signal G2 having a logic "low" state is applied to a gate of the driver 90. Consequently the driver 90 is turned on, so that the external source voltage ext.Vcc is directly applied to the memory elements.

If the voltage level of the external source voltage ext.Vcc is lower than the voltage level of the reference voltage Vref, the low reference voltage generating circuit 400 generates an output signal having a logic "low" state. The output signal of the low reference voltage generator 400 is converted to signal G4 having logic "high" state by inverter I4. Hence, the output signal of NOR-gate NOR1 has a logic "low" state, thus turning off the transmission gates N4, P3. In addition, the signal G4 having the logic "high" state turns on a pull-down transistor N6. Accordingly, the voltage level G2 goes to ground voltage level, so that the driver 90 is fully turned on thereby applying the external source voltage ext.Vcc to the memory elements of the memory device. Meanwhile, the transmission gates N4, P3 are turned off to prevent the driver 90 from receiving the output of the comparator 200. This causes the external source voltage ext.Vcc to be stably applied to the memory elements even if the voltage level of the internal source voltage int.Vcc is lower that the voltage level of the reference voltage Vref. Hence the operating speed of the memory device is properly maintained.

Figure 3:
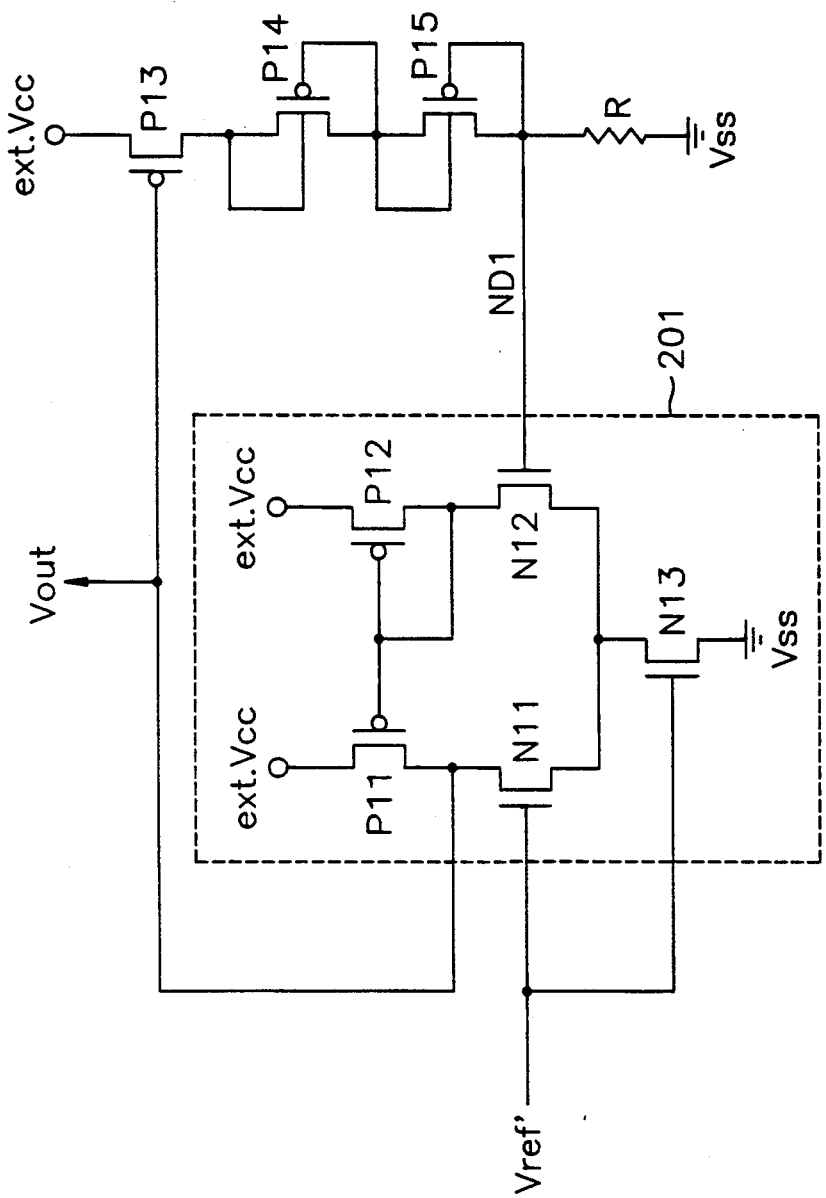
FIG. 3 is a schematic diagram of the low reference voltage generating circuit of FIG. 2.

The low reference voltage generating circuit 400 is shown in FIG. 3. If a voltage Vref' is constant, the sizes of PMOS transistors P14 and P15 which function as diodes and the value of resistor R may be adjusted so as to establish a desired voltage level at node ND1 by voltage division. When the external source voltage, ext.Vcc, is applied, the voltage level of the node ND1 goes lower as the voltage ext.Vcc drops. When the voltage level of node ND1 drops below Vref' the comparator 201 latches. Hence, an output signal Vout having a logic "low" state becomes the output signal G4 having a logic "high" state through the inverter I4 of FIG. 2.

If the voltage level of the external source voltage is higher than the voltage level of the reference voltage, the internal source voltage having a predetermined voltage level is applied to the memory elements in accordance with the circuit of the present invention. Alternatively, if the voltage level of the external source voltage is lower than the voltage level of the reference voltage, the external source voltage is directly applied to the memory elements, thus improving the operating speed of the memory.

While the present invention has been disclosed in connection with one preferred embodiment thereof, it should be appreciated that there may be other embodiments of the invention which fall within spirit and scope of the invention as defined by the appended claims.

What is claimed is:

1. A circuit for generating upon receipt of a given external source voltage, an internal source voltage to be applied to memory elements of a semiconductor device, comprising;
    a first reference voltage generating means for generating a reference voltage;
    means for comparing said internal source voltage with said reference voltage and for generating an output indicative of the comparison;
    driving means connected between said external source voltage and said internal source voltage for coupling said external source voltage to said internal source voltage under control of said output of said comparing means;
    a second reference voltage generating means for generating a control signal when a voltage level of said external source voltage is lower than a voltage level of said reference voltage;
    means connected between said comparing means and said driving means and responsive to said control signal for turning on said driving means and for preventing said driving means from receiving said output of said comparing means, so that said external source voltage is coupled to said internal source voltage when the voltage level of said external source voltage is lower than the voltage level of said reference voltage, and,
    wherein the state of said control signal is changed according to the voltage level of said external source voltage.

2. A circuit as defined in claim 1, wherein said second reference voltage generating means comprises at least a voltage comparator and voltage divider.

3. A circuit for generating upon receipt of a given external source voltage an internal source voltage to be applied to memory elements of a semiconductor device, said circuit comprising;
    a first reference voltage generating means for generating a reference voltage;
    means for comparing said internal source voltage with said reference voltage and for generating an output indicative of the comparison;
    driving means connected between said external source voltage and said internal source voltage for coupling said external source voltage to said internal source voltage under control of said output of said comparing means;
    a second reference voltage generating means for generating a control signal when a voltage level of said external source voltage is lower than a voltage level of said reference voltage;
    means connected between said comparing means and driving means and responsive to said output of said comparing means for turning on said driving means; and
    means connected between said second reference voltage generating means and said driving means and responsive to said control signal for turning on said driving means and for preventing said driving means from receiving said output of said comparing means, so that said external source voltage is coupled to said internal source voltage when the voltage level of said external source voltage is lower than the voltage level of said reference voltage.

4. A circuit as defined in claim 3, wherein the state of said control signal is changed according to the voltage level of said external source voltage.

5. A circuit as defined in claim 4, wherein said second reference voltage generating means comprises at least a voltage comparator and voltage divider.

* * * * *